United States Patent
Golick et al.

(10) Patent No.: US 8,222,719 B2
(45) Date of Patent: Jul. 17, 2012

(54) QUAD FLAT NO LEAD (QFN) INTEGRATED CIRCUIT (IC) PACKAGE HAVING A MODIFIED PADDLE AND METHOD FOR DESIGNING THE PACKAGE

(75) Inventors: Lawrence Wayne Golick, Nazareth, PA (US); Scott E. Hynes, Macungie, PA (US); Thomas J. Pllyer, Bethlehem, PA (US)

(73) Assignee: Agere Systems, Inc., Allentown, PA (US)

( * ) Notice: Subject to any disclaimer, the term of this patent is extended or adjusted under 35 U.S.C. 154(b) by 397 days.

(21) Appl. No.: 12/526,334

(22) PCT Filed: Feb. 12, 2007

(86) PCT No.: PCT/US2007/003648
§ 371 (c)(1),
(2), (4) Date: Aug. 7, 2009

(87) PCT Pub. No.: WO2008/100247
PCT Pub. Date: Aug. 21, 2008

(65) Prior Publication Data
US 2010/0148329 A1   Jun. 17, 2010

(51) Int. Cl.
*H01L 23/495* (2006.01)
(52) U.S. Cl. .................. 257/676; 257/666; 438/123
(58) Field of Classification Search .......... 257/666, 257/676, 706, 707; 438/111, 123, 122, 124
See application file for complete search history.

(56) References Cited

U.S. PATENT DOCUMENTS

| | | | |
|---|---|---|---|
| 6,025,640 A | 2/2000 | Yagi et al. | |
| 6,476,469 B2 * | 11/2002 | Hung et al. | 257/676 |
| 6,794,740 B1 | 9/2004 | Edwards et al. | |
| 6,809,409 B2 | 10/2004 | Fukui et al. | |
| 6,927,483 B1 * | 8/2005 | Lee et al. | 257/676 |
| 7,033,866 B2 | 4/2006 | Chow et al. | |
| 2003/0071333 A1 | 4/2003 | Matsuzawa | |
| 2005/0121756 A1 | 6/2005 | Chow et al. | |
| 2006/0255438 A1 | 11/2006 | Omori et al. | |
| 2011/0140250 A1* | 6/2011 | Lee | 257/670 |
| 2011/0266662 A1* | 11/2011 | Hsia et al. | 257/676 |

FOREIGN PATENT DOCUMENTS

JP   2001077278   3/2001

OTHER PUBLICATIONS

PCT Search Report for PCT/US2007/003648, mailed Feb. 12, 2008.

* cited by examiner

*Primary Examiner* — Sheila V. Clark

(57) ABSTRACT

A QFN IC package is provided that has all of the advantages of the typical QFN IC package, but in addition, has a paddle that is configured to facilitate trace routing and/or via placement on the PWB or PCB on which the IC package is mounted. By configuring the paddle as necessary or desired in order to facilitate routing and/or via placement, the overall size of the PWB or PCB can be reduced without sacrificing the thermal or electrical performance advantages that the paddle provides. In addition, the reduction in the overall size of the PWB or PCB results in reduced cost.

10 Claims, 4 Drawing Sheets

QUAD FLAT NO LEAD (QFN) INTEGRATED CIRCUIT (IC) PACKAGE HAVING A MODIFIED PADDLE AND METHOD FOR DESIGNING THE PACKAGE

TECHNICAL FIELD OF THE INVENTION

The invention relates to integrated circuits (ICs), and more particularly, to a Quad Flat No Lead (QFN) IC having a paddle that is modified to facilitate routing and/or via placement in the printed wiring board (PWB) or printed circuit board (PCB) on which the QFN IC is mounted.

BACKGROUND OF THE INVENTION

The original QFN IC was designed by Amkor Technology, Inc. of Chandler, Ariz., but other companies also make and sell QFN IC packages, such as Texas Instruments Incorporated of Dallas, Tex. The typical QFN IC package comprises an IC die mounted on a paddle, which, in turn, is attached to a metal leadframe. The metal leadframe is wire bonded during a wire bonding process to connect the input/output (I/O) pads of the IC die to external lands of the package. The die attach and wire bonding processes are normally performed simultaneously on many like QFN IC packages while they are attached to the same leadframe. An over molding process is then performed during which the leadframe assembly having the QFN IC packages attached to it is over molded in plastic. After the over molding process has been performed, a singulation process is performed to separate the IC packages from the leadframe into individual IC packages. The resulting IC package is a square or rectangular package having external package lands for connecting the package to a PWB or PCB. These external package lands are exposed and flush around the bottom perimeter of the package. The paddle that the IC is mounted on is also flush and exposed on the bottom of the package.

The final QFN IC package is soldered onto a PWB or PCB by soldering the paddle located on the bottom of the package to the PWB or PCB. The PWB or PCB designer then routes traces on the PWB or PCB to the individual lands of the IC package, which are then electrically connected by soldering to make the electrical connections between the IC lands and other elements mounted on the PWB or PCB. The paddle is made of a thermally conductive material and functions as a heat spreader and heat sink device. The paddle can also be used to provide a stable ground for the IC package by using down bonds or an electrically conductive die attach material to provide the electrical ground path from the IC package to the PWB or PCB.

The typical QFN IC package of the type described above is small in size, light in weight, and has a low profile (i.e., small thickness) due to it being generally flat relative to typical IC packages that have leads that rotrude from the bottom or sides of the package. Therefore, the QFN IC package is particularly well suited for use in devices that are small in size, such as small hand-held devices (e.g., cellular telephones, personal digital assistants (PDAs), etc.). In addition, the paddle provides the IC package with very good thermal and electrical performance.

The size of a typical QFN IC package generally depends on the number of lands that are in the package and the size of the IC die. QFN IC packages are available with different numbers of lands, such as, for example, 12 lands, 28 lands, 44 lands, etc. A 12-land QFN IC package may be, for example, 3 millimeters (mm) by 3 mm in size whereas a 28-land package may be, for example 5 mm by 5 mm in size. The die is typically slightly smaller in size than the paddle size for the reasons described above, i.e., to allow for die attach epoxy bleedout and electrical ground bonding. For example, in a 28-land QFN IC package offered by Amkor Technology, Inc., the die is 2.54 mm by 2.54 mm in size while the exposed portion of the paddle is 2.70 mm by 2.70 mm in size. The extra space between the sides of the die and the sides of the paddle provides room for epoxy bleed out from the die attach adhesive and also provides room for wire bonds for grounding the IC to the paddle. The paddle is needed because it provides thermal and electrical pathways needed for good thermal and electrical performance.

FIG. 1 illustrates a bottom plan view of a typical QFN IC package 5 of the type described above having a plurality of lands 6 on each side of the package 5, a die 7, a paddle 8, and a molded plastic body 8. In this example, the die 7 is square in shape in the X and Y dimensions and is mounted on the paddle 8, which is also square in shape in the X and Y dimensions. The die 7 is smaller in the X and Y dimensions than the paddle 8 to allow room for bleedout of the epoxy die attach material used to attach the die 7 to the paddle 8 and to allow room for wire bonding for electrically grounding the die 7 to the paddle 8. The paddle 8 includes an unexposed portion 9A and an exposed portion 9B. The die 7 is attached to the top surface of the unexposed portion 9A of the paddle 8. The bottom surface of the exposed portion 9B of the paddle 8 is soldered to the PWB or PCB (not shown).

FIG. 2 illustrates a side view of a portion of the QFN IC package 5 depicted in FIG. 1. In this example, the die 7 is 7.5 mils ($10^{-3}$ inches) thick (the Z dimension) and is square shape with a width and length (the X and Y dimensions) of 2.3 mm. The top surface of the unexposed portion 9A of the paddle 8 has a recess 12 formed in it where the die 7 is attached to provide a seat for the die 7 and to contain the die attach material bleedout. The bottom surface of the exposed portion 9B of the paddle 8 is also square in shape and has a width and length (the X and Y dimensions) of 3.8 mm, which equates to an area of about 14.44 mm². Because the bottom surface of the exposed portion 9B of the paddle is flush with the IC package, after the exposed portion 9B has been soldered to the PCB or PWB, no traces can be routed and no vias can be placed in the portion of the PWB or PCB on which the exposed portion 9B is mounted. This can be a problem because it reduces flexibility with respect to trace routing and via placement, especially in cases where the PWB or PCB is small in size, such as when used in a cellular telephone or PDA, for example. In addition, because the paddle 8 blocks off trace routing and/or via placement, it may be necessary to increase the number of layers of the PCB or PWB or to use a more expensive laminate array package to obtain a desired solution. Accordingly, a need exists for a QFN IC package having a paddle that is configured in such a way that it does not block off PWB or PCB routings or via placements. A need also exists for a method for determining a paddle configuration that allows for trace routing and/or via placement while also providing the aforementioned thermal and electrical performance advantages.

SUMMARY OF THE INVENTION

The invention provides a QFN IC package having a modified paddle configuration and a method for designing a QFN IC package having a modified paddle configuration. The QFN IC package comprises a die mounted on a leadframe and an encasement. The leadframe has one or more electrically conductive lands and an electrically and thermally conductive paddle. The paddle has an exposed portion and an unexposed portion. The unexposed portion of the paddle having a top surface having a width in an X dimension and a length in a Y dimension, the top surface of the unexposed portion having an area equal to the width of the top surface of the unexposed portion times the length of the top surface of the unexposed portion, the bottom surface of the exposed portion of the paddle having a width in the X dimension and a length in the Y dimension, the bottom surface of the exposed portion having an area equal to the width of the bottom surface of the exposed portion of the paddle times the length of the bottom surface of the exposed portion. The bottom surface of the exposed portion of the paddle is exposed through the encasement and is substantially flush with the encasement. The area of the bottom surface of the exposed portion of the paddle is smaller than the area of the top surface of the unexposed portion of the paddle.

The method comprises receiving information about a configuration of a PWB or PCB on which the IC package is intended to be mounted, creating a paddle configuration based on the information about PWB or PCB configuration, determining whether the leadframe having the paddle configuration meets leadframe manufacturability constraints, determining whether a QFN IC package comprising the leadframe having the paddle configuration meets IC package manufacturability constraints, and determining whether a QFN IC package comprising the leadframe having the paddle configuration meets heat dissipation constraints.

These and other features and advantages of the invention will become apparent from the following description, drawings and claims.

DETAILED DESCRIPTION OF ILLUSTRATIVE EMBODIMENTS

In accordance with the invention, a QFN IC package is provided that has all of the advantages of the typical QFN IC package described above, but in addition, has a paddle that is configured to facilitate trace routing and/or via placement on the PWB or PCB on which the IC package is mounted. By configuring the paddle as necessary or desired in order to facilitate routing and/or via placement, the overall size of the PWB or PCB can be reduced without sacrificing the thermal or electrical performance advantages that the paddle provides. In addition, the reduction in the overall size of the PWB or PCB results in reduced cost. A few examples of the manner in which the paddle may be configured to meet these goals will now be described with reference to a few illustrative embodiments. The invention is not limited to these embodiments. These embodiments are being described to demonstrate the principles and concepts of the invention.

Figure 3:
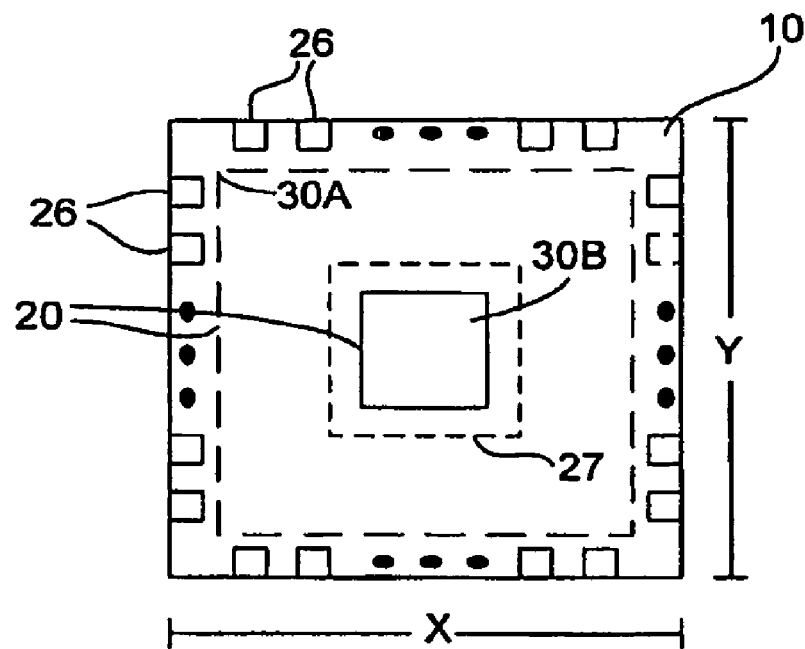
FIG. 3 illustrates a bottom plan view of the QFN IC package of the invention in accordance with one illustrative embodiment having a paddle that is configured in accordance with the invention to allow trace routing and/or via placement in the PWB or PCB beneath the paddle.

FIG. 3 illustrates a bottom plan view of the QFN IC package 10 of the invention in accordance with one illustrative embodiment having a paddle 20 that is configured In accordance with the invention to allow trace routing and/or via placement in the PWB or PCB beneath the paddle 20. The package 10 includes a plurality of lands 26, a die 27 and a paddle 20 having an unexposed portion 30A and an exposed portion 30B. The die 27 is mounted on the top surface of the unexposed portion 30A of the paddle 20. In this example, the die 27 is 6 mils thick (in the Z dimension) and is square in shape with a width and length (the X and Y dimensions) of 2.3 mm. Therefore, the die-attach surface area is 5.29 mm$^2$. The die 27 typically has a thickness that is less than or equal to about 7 mils.

In this example, the exposed portion 30B of the paddle 20 is square in shape and has a width and length of 1.85 mm. The width and length of the exposed portion 30B are typically, but not necessarily, equal in size and range from about 0.5 mm to 3.5 mm. This equates to the exposed portion 30B having an area on its bottom surface that typically ranges from about 0.25 mm$^2$ to about 12.25 mm$^2$. Thus, the exposed portion 30B comprising the bottom surface of the paddle 20 shown in FIG. 3 having a width and length of 1.85 mm equates to an area of 3.42 mm$^2$, which is about 36% smaller than the die area and about 76% smaller than the area of the exposed portion 9B of the paddle 8 shown in FIG. 2. This reduction in the area of the exposed portion 30B of the paddle 20 accommodates trace routing and/or via placement on the PWB or PCB below the IC package 10.

Figure 4:
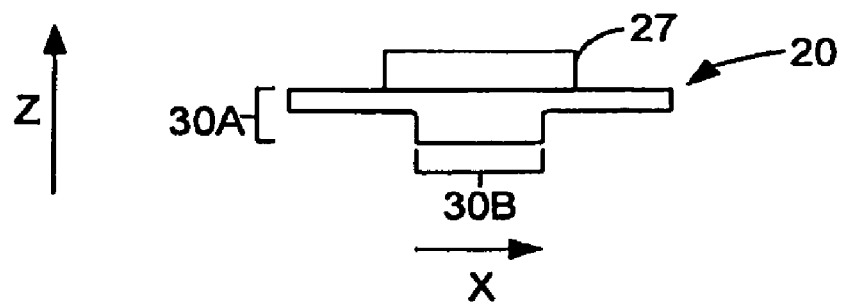
FIG. 4 illustrates a side view of the QFN IC package depicted in FIG. 3 without the plastic over-molded encasement and without the lands and leadframe.

FIG. 4 illustrates a side view of the QFN IC package 10 depicted in FIG. 3 without the plastic over-molded encasement and without the lands and leadframe. Unlike the package 8 shown in FIG. 2, the unexposed portion 30A of the paddle 20 shown in FIG. 4 does not have the recess formed in it where the die 27 is attached. Rather, the top surface of the unexposed portion 30A where the die 27 is attached is generally flat in shape, but is larger in the X and Y dimensions than the die 27 to provide room for wire ground bonds and die attach material bleedout. Because the die 27 is thinner (e.g., 6 mils) than the die 7 (7.5 mils), the package 10 has a low profile and is suitable for use in very small form factor applications, such as in cellular phones, PDAs and other handheld devices, for example. In addition, because the top surface of the unexposed portion 30A does not have material removed from it to form a recess where the die is attached, more of the top surface area is available to spread heat generated by the die 27.

Figure 5:
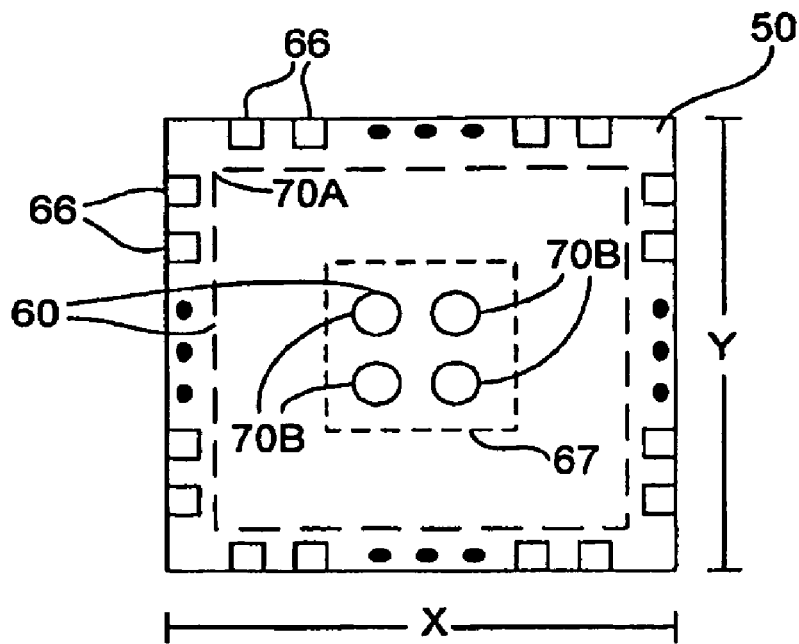
FIG. 5 illustrates a bottom plan view of the QFN IC package of the invention in accordance with another illustrative embodiment having a paddle that is configured in accordance with the invention to allow trace routing and/or via placement in the PWB or PCB beneath the paddle.
Figure 6:
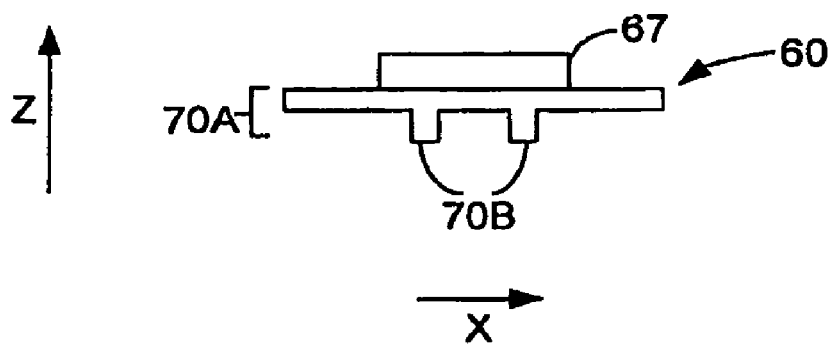
FIG. 6 illustrates a side view of the QFN IC package depicted in FIG. 5 without the plastic over-molded encasement and without the lands and leadframe.

FIG. 5 illustrates a bottom plan view of the QFN IC package 50 of the invention in accordance with another illustrative embodiment having a paddle 60 that is configured in accordance with the invention to allow trace routing and/or via placement in the PWB or PCB beneath the paddle 60. FIG. 6 illustrates a side view of the QFN IC package 50 depicted in FIG. 5 without the plastic over-molded encasement and without the lands and leadframe. The paddle 60 has an unexposed portion 70A and an exposed portion 70B. The package 50 is similar to the package 10 shown in FIGS. 3 and 4 except that the exposed portion 70B of the paddle 60 comprises one or more pillars, each of which has a bottom surface for attachment to the PWB or PCB. The locations of the pillars 70B are selected so that they do not interfere with elements on the PWB or PCB and to facilitate trace routing. The sizes and shapes of the pillars 70B can be selected with flexibility based on trace routing needs and based on thermal and/or electrical performance criteria. Each pillar is typically, but not necessarily, substantially cylindrical in shape. The pillars could, however, have a different shape such as a rectangular shape, for example.

Each pillar 70B typically has a diameter that ranges from about 0.2 to about 2.0 mm. This equates to a surface area per pillar that ranges from about 0.0314 mm$^2$ to about 3.14 mm$^2$. This means that the total surface area on the PWB or PCB that is consumed by an exposed portion 70B having four such pillars typically ranges from about 0.125 mm$^2$ to about 12.56 mm$^2$, which in all cases in much smaller than the area of the exposed portion 9B of the paddle 8 (14.44 mm$^2$) shown in FIG. 2.

Figure 1:
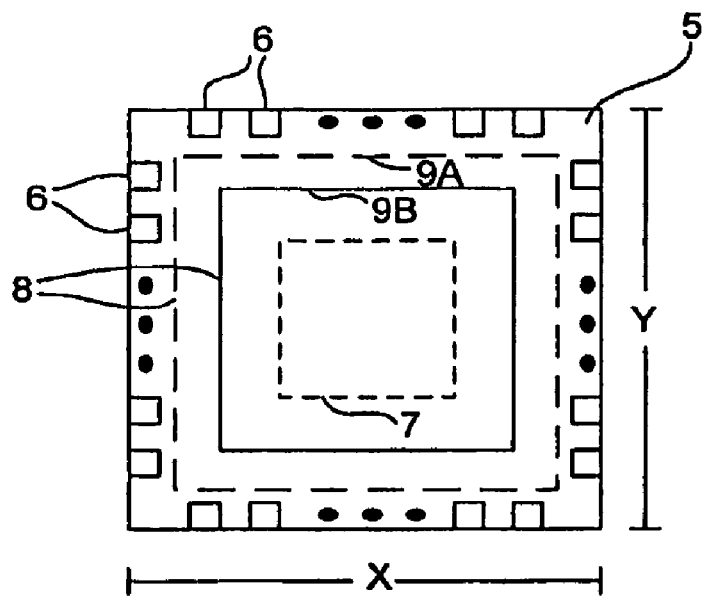
FIG. 1 illustrates a bottom plan view of a typical QFN IC package of the type described above having a plurality of lands on each side of the package, a die, a paddle, and a molded plastic body.
Figure 2:
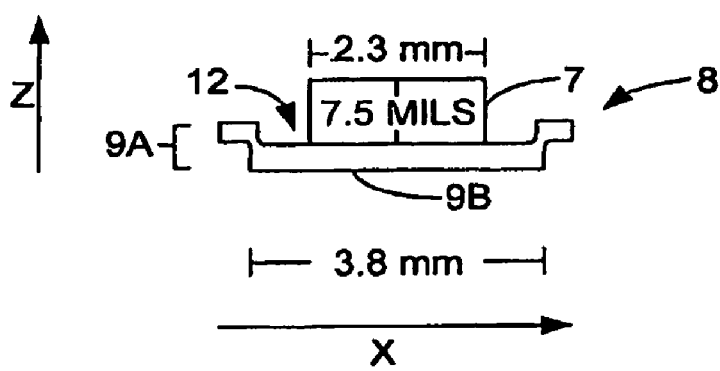
FIG. 2 illustrates a side view of a portion of the QFN IC package depicted in FIG. 1.

Unlike the IC package 8 shown in FIG. 2, the unexposed portion 70A of the paddle 60 shown in FIG. 6 does not have the cup-shaped recess formed in it. Rather, the top surface of the unexposed portion 70A is generally flat, but is larger in the X and Y dimensions than the die 67 to provide room for wire ground bonds and bleedout of the die attach material. The die 67 shown in FIGS. 5 and 6 is thinner (6 mils) than the die 7 (7.5 mils) shown in FIGS. 1 and 2. Therefore, even without the paddle 60 having a recess formed in it, the package 50 has a low profile and is suitable for use in very small form factor applications, such as, for example, in cellular phones, PDAs and other handheld devices. In addition, because the top surface of the unexposed portion 70A does not have the recess formed in it, more of the top surface area is available to spread heat generated by the die 67.

Figure 7:
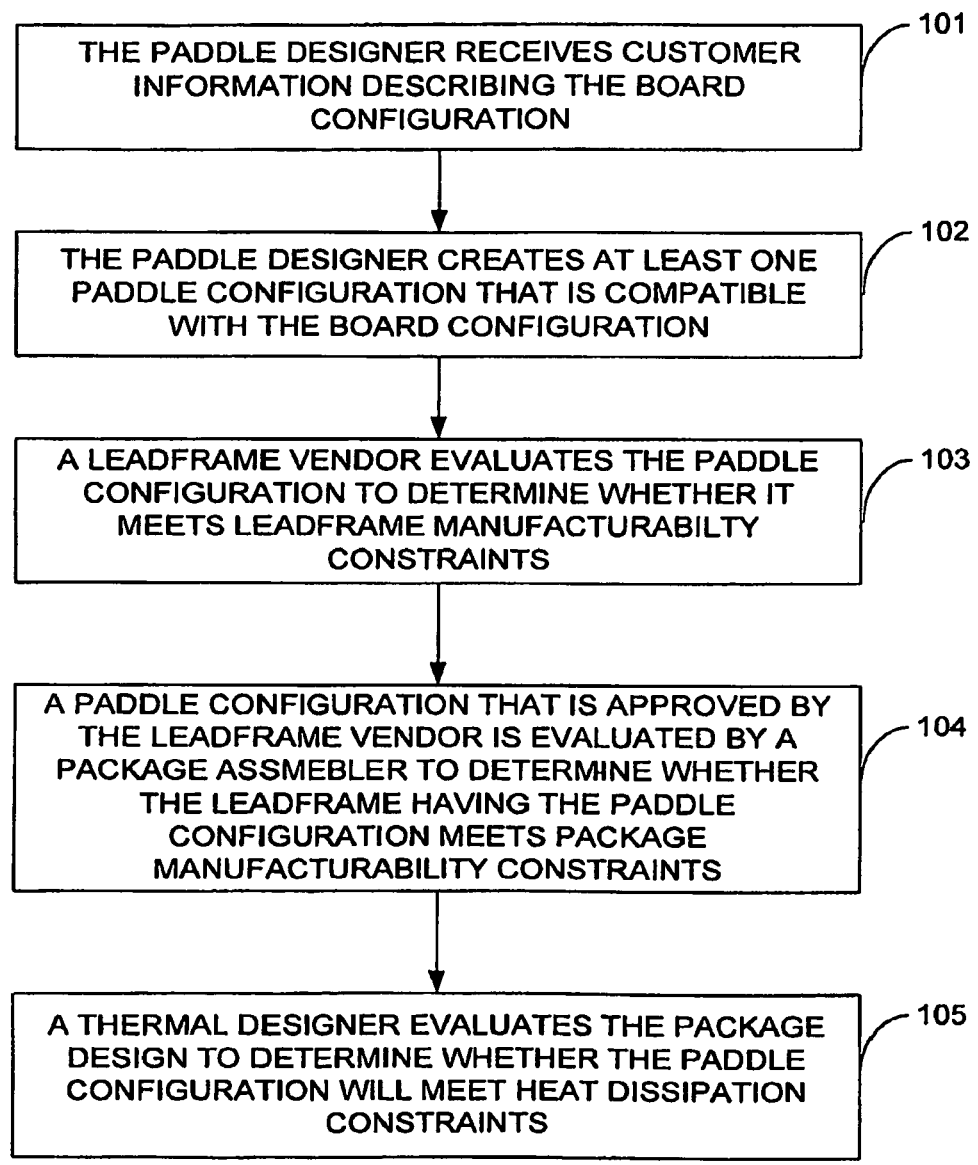
FIG. 7 illustrates a flowchart that demonstrates the method of the invention in accordance with an illustrative embodiment for designing a paddle for a particular application.

FIG. 7 illustrates a flowchart that demonstrates the method of the invention in accordance with an illustrative embodiment for designing a paddle for a particular application. The paddle needs to be large enough to attach the die with space for bleedout of die attach material and electrical ground wire bonds, while also having an exposed portion that is reduced in area to provide trace routing and/or via connection flexibility. Meeting these goals helps drive down overall costs in cases where miniaturization is required because extras space is freed up on the PWB or PCB, which allows lower tolerance design rules to be applied that result in reduced overall costs.

The QFN IC paddle designer receives information from the customer regarding the customer's desired or required PWB or PCB board configuration, including trace routing and/or via placement preferences or constraints. This step is represented by block 101. The paddle designer then creates one or more paddle configuration designs that have reduced exposed portions to accommodate the customer's board configuration. This step is represented by block 102. Typically, the paddle designer will create multiple configuration designs that meet the customer's request. The paddle configuration design or designs are then forwarded to a leadframe vendor who determines whether the paddle configuration meets leadframe manufacturability constraints. This step is represented by block 103. A leadframe design having a paddle configuration that meets leadframe manufacturability constraints is then forwarded to a package assembler who determines whether a package having the leadframe design with the paddle configuration meets package manufacturability constraints. This step is represented by block 104. The package design having the leadframe and paddle configuration is then evaluated by a thermal designer to determine whether the paddle configuration will meet heat dissipation constraints. This step is represented by block 105.

The process represented by blocks 101-105 may be iterated multiple times until a determination is made that a QFN IC package design has been achieved that can be manufactured, that has a paddle configuration that meets with the customer's requests, and that will provide adequate heat dissipation. In addition, the order in which the processes represented by blocks 101-105 is not critical and can be varied as desired. For example, the process represented by block 105 may be performed before the processes represented by block 103 and/or 104 are performed. Similarly, the process represented by block 104 may be performed before the process represented by block 103 is performed. Also, the processes represented by blocks 102-105 may be performed by the same entity or by one or more entities that work together to achieve a final package design.

It should be noted that the invention has been described with reference to illustrative embodiments and that the invention is not limited to these embodiments. Those skilled in the art will understand, in view of the description provided herein, that many modifications may be made to the embodiments described herein without deviating from the scope of the invention. For example, while a QFN IC package has been described herein, the invention equally applies to a leadframe for use in a QFN IC package. Such a leadframe has a paddle that has an exposed bottom surface for attachment to a printed circuit or printed wiring board that is smaller in area than the area of the bottom surface of the die that is intended to be attached to the leadframe. The leadframe may be any shape, including rectangular, circular, symmetrical, asymmetrical, etc. Also, the invention is not limited with respect to the manner in which the leadframe design having the paddle with the smaller exposed surface area is selected. One or more of a variety of considerations may be taken into account in selecting the leadframe design, including, for example, but not limited to, the PCB or PWB design, one or more thermal dissipation constraints, one or more leadframe manufacturability constraints and one or more package manufacturability constraints.

What is claimed is:

1. A Quad Flat No Lead (QFN) integrated circuit (IC) package comprising:

a leadframe comprising one or more electrically conductive lands and an electrically and thermally conductive paddle, the paddle having an exposed portion and an unexposed portion, the unexposed portion of the paddle having a top surface having a width in an X dimension and a length in a Y dimension, the top surface of the unexposed portion having an area equal to the width of the top surface of the unexposed portion times the length of the top surface of the unexposed portion, the bottom surface of the exposed portion of the paddle for attachment to a printed circuit or printed wiring board and having a width in the X dimension and a length in the Y dimension, the bottom surface of the exposed portion having an area equal to the width of the bottom surface of the exposed portion of the paddle times the length of the bottom surface of the exposed portion;

a die having a bottom surface attached to the top surface of the unexposed portion of the paddle, the die having a width in an X dimension and a length in a Y dimension, the bottom surface of the die having an area equal to the width of the die times the length of the die;

an encasement that at least partially encases the leadframe and the die, the lands having ends that are exposed through the encasement and that are substantially flush with the encasement, the bottom surface of the exposed portion of the paddle being exposed through the encasement and substantially flush with the encasement; and wherein the area of the bottom surface of the exposed portion of the paddle is smaller than the area of the top surface of the unexposed portion of the paddle, the area of the bottom surface of the exposed portion of the paddle is also smaller than the area of the bottom surface of the die, the bottom surface of the exposed portion of the paddle is substantially flat and has a shape which is substantially the same as the bottom surface of the die, and the bottom surface of the exposed portion of the paddle is generally square in shape and has a width and length that are equal and range from about 0.5 mm to 3.5 mm, and wherein the area of the bottom surface of the exposed portion ranges from about 0.25 millimeters squared ($mm^2$) to about 12.25 $mm^2$.

2. The QFN IC package of claim 1, wherein the bottom surface of the exposed portion has a length and width of about 1.85 mm, the area of the bottom surface of the exposed portion being about 3.42 $mm^2$.

3. The QFN IC package of claim 1, wherein the top surface of the unexposed portion of the paddle is substantially flat and has an area that is larger than the area of the bottom surface of the die.

4. The QFN IC package of claim 1, wherein the exposed portion of the paddle comprises at least two pillars that are generally cylindrical in shape, each pillar having a top surface that coincides with a bottom surface of the unexposed portion of the paddle, the pillars having respective bottom surfaces that make up the bottom surface of the exposed portion of the paddle.

5. A Quad Flat No Lead (QFN) integrated circuit (IC) package comprising:
a leadframe comprising one or more electrically conductive lands and an electrically and thermally conductive paddle, the paddle having an exposed portion and an unexposed portion, the unexposed portion of the paddle having a top surface having a width in an X dimension and a length in a Y dimension, the top surface of the unexposed portion having an area equal to the width of the top surface of the unexposed portion times the length of the top surface of the unexposed portion, the bottom surface of the exposed portion of the paddle for attachment to a printed circuit or printed wiring board and having a width in the X dimension and a length in the Y dimension, the bottom surface of the exposed portion having an area equal to the width of the bottom surface of the exposed portion of the paddle times the length of the bottom surface of the exposed portion;
a die having a bottom surface attached to the top surface of the unexposed portion of the paddle, the die having a width in an X dimension and a length in a Y dimension, the bottom surface of the die having an area equal to the width of the die times the length of the die;

an encasement that at least partially encases the leadframe and the die the lands having ends that are exposed through the encasement and that are substantially flush with the encasement, the bottom surface of the exposed portion of the paddle being exposed through the encasement and substantially flush with the encasement; and
wherein the area of the bottom surface of the exposed portion of the paddle is smaller than the area of the top surface of the unexposed portion of the paddle, the area of the bottom surface of the exposed portion of the paddle is also smaller than the area of the bottom surface of the die, the bottom surface of the exposed portion of the paddle is substantially flat and has a shape which is substantially the same as the bottom surface of the die, and the die has a thickness in a Z dimension that is less than or equal to about 7 mils, a mil being equal to $10^{-3}$ inches.

6. A leadframe for Quad Flat No Lead (QFN) integrated circuit (IC) package, the leadframe comprising:
one or more electrically conductive lands; and
an electrically and thermally conductive paddle, the paddle having an exposed bottom surface for attachment to a printed circuit or printed wiring board and having an unexposed top surface for attachment to a bottom surface of a die, the exposed bottom surface of the paddle being smaller in area than the unexposed top surface of the paddle, the exposed bottom surface of the paddle also being smaller in the area than the bottom surface of the die, the exposed bottom surface of the paddle is substantially flat and has a shape which is substantially the same as the bottom surface of the die, wherein the exposed bottom surface of the paddle is generally square in shape and has a width and length that are less than about 3.5 mm and an area of less than 12.25 $mm^2$.

7. The leadframe of claim 6, wherein the exposed bottom surface of the paddle is substantially flat.

8. A method for creating a leadframe for Quad Flat No Lead (QFN) integrated circuit (IC) package, the method comprising:
selecting a leadframe design having a paddle with a bottom exposed surface for attachment to a printed circuit board or printed wiring board that is smaller in area than a top surface of an unexposed portion of the paddle; and
attaching the top surface of the unexposed portion of the paddle to a bottom surface of a die, the bottom exposed surface of the paddle being smaller in the area than the bottom surface of the die, the bottom exposed surface of the paddle is substantially flat, has a shape which is substantially the same as the bottom surface of the die, and has a width and length that are less than 3.5 mm.

9. The method of claim 8, wherein the leadframe design is selected based on a design of a printed circuit board or printed wiring board to which the bottom exposed surface is to be attached.

10. The method of claim 8, wherein the die has a thickness is a Z dimension that is less than approximately 7 mils, a mil being equal to $10^{-3}$ inches.

* * * * *